United States Patent [19]

Preiner et al.

[11] Patent Number: 4,595,471
[45] Date of Patent: Jun. 17, 1986

[54] ORGANOPOLYSILOXANE COMPOSITIONS CROSSLINKABLE BY ULTRAVIOLET LIGHT AND A PROCESS FOR ENCAPSULATING ELECTRONIC COMPONENTS

[75] Inventors: Gerhard Preiner, Burghausen; Klaus Matejcek, Munich, both of Fed. Rep. of Germany

[73] Assignee: Wacker-Chemie GmbH, Munich, Fed. Rep. of Germany

[21] Appl. No.: 762,756

[22] Filed: Aug. 6, 1985

[30] Foreign Application Priority Data

Sep. 13, 1984 [DE] Fed. Rep. of Germany ....... 3433654

[51] Int. Cl.$^4$ ................................................ C08F 2/46
[52] U.S. Cl. ..................................... 522/29; 427/54.1; 528/12; 528/16; 528/17; 528/30; 528/32; 522/99
[58] Field of Search ........................ 528/16, 17, 30, 32, 528/12; 427/54.1; 204/159.13

[56] References Cited

U.S. PATENT DOCUMENTS 4,046,795  9/1977  Martin ..................................... 528/21
4,290,869  9/1981  Pigeon .................................... 528/18

Primary Examiner—Melvyn I. Marquis

[57] ABSTRACT

Organopolysiloxane compositions that are crosslinked by ultraviolet light comprising (A) an organopolysiloxane having units of the formula $$HR^1C=CR^2COOR^3SiR_2O_{\frac{1}{2}},$$

in which at least two such siloxane units are present per molecule of organopolysiloxane (A) and at least 80 percent of the number of the remaining siloxane units in organopolysiloxane (A) comprise units of the formula $$R_2SiO,$$

where R is a monovalent hydrocarbon radical or a halogenated monovalent hydrocarbon radical, $R^1$ is hydrogen or a halogenated phenyl radical, $R^2$ is hydrogen or an alkyl radical having from 1 to 4 carbon atoms per radical and $R^3$ is a divalent hydrocarbon radical or a halogenated divalent hydrocarbon radical, in which the organopolysiloxane (A) has an average viscosity of from 20 to 5000 mPa.s at 25° C., (B) an organopolysiloxane terminated by units of the formula $R_3SiO_{1/2}$, and having from 0.05 to 5 mole percent of units of the formula $$HSR^3R_aSiO_{\frac{3-a}{2}},$$

wherein R and $R^3$ are the same as above and a is 0 or 1, and at least 99 mole percent of the remaining siloxane units, other than the triorganosiloxy groups, comprise units of the formula $$R_2SiO,$$

where R is the same as above, in which organopolysiloxane (B) has an average viscosity of from 50 to 2000 mPa.s at 25° C., and (C) a photosensitizer, in which Si-bonded hydroxy groups that are present in units of the formula $$R_2SiO$$

are present in an amount which does not exceed 0.2 hydroxy groups per group of the formula $$HR_1C=CR^2COOR^3—,$$

and a total of at most 0.02 percent by weight, based on the total weight of the organopolysiloxane (A), organopolysiloxane (B) and photosensitizer (C), of organic titanium or organic tin compounds are present in the compositions. These crosslinkable compositions are useful for encapsulating electronic components.

15 Claims, No Drawings

ORGANOPOLYSILOXANE COMPOSITIONS CROSSLINKABLE BY ULTRAVIOLET LIGHT AND A PROCESS FOR ENCAPSULATING ELECTRONIC COMPONENTS

The present invention relates to crosslinkable organopolysiloxane compositions and particularly to organopolysiloxane compositions which crosslink rapidly when exposed to ultraviolet light. More particularly, the present invention relates to crosslinkable organopolysiloxane compositions which may be used for encapsulating electronic components.

BACKGROUND OF THE INVENTION

Photopolymerizable organopolysiloxane compositions having SiC-bonded acryloxyalkyl or methacryloxyalkyl groups and mercaptoalkyl groups are described in U.S. Pat. No. 4,290,869 to Pigeon. In these compositions, silanes are present in addition to organopolysiloxanes, because in preparing the constituents used in the preparation of the compositions, at most only 45 percent by weight of the theoretical amount of alkanol is released. Pigeon also discloses at column 8, lines 36 to 38, that the compositions described in the patent have a shelf life of about 48 hours in closed, opaque containers.

In contrast to the compositions described in U.S. Pat. No. 4,290,869, the compositions of this invention are free of, or at least have fewer Si-bonded hydroxyl groups in the $R_2SiO$ units and are free of, or at least have fewer organic titanium or tin compounds than the compositions described by Pigeon. Moreover, the compositions of the present invention contain units of the formula $R_3SiO_{\frac{1}{2}}$, whereas these units are absent from the compositions of Pigeon.

Therefore, it is an object of the present invention to prepare compositions from readily available materials which can be stored in sealed containers with the exclusion of light, especially ultraviolet light, for at least 6 months. Another object of the present invention is to prepare compositions which are of sufficiently low viscosity prior to their crosslinking to be capable of penetrating even into comparatively narrow gaps. Another object of the present invention is to provide one-component systems which do not crosslink in the apparatus used for their final processing when the apparatus is shut-down for a period of time and thus obviates cleaning of the apparatus. Still another object of the present invention is to provide compositions which do not give off an unpleasant odor and crosslink rapidly under the influence of ultraviolet light at room temperature or at temperatures not exceeding 100° C. Still another object of the present invention is to provide compositions in which crosslinking is not impaired by atmospheric oxygen to an extent which appreciably affects encapsulating of electronic components; and which, on crosslinking, yield products that are transparent and have a soft and gel-like consistency. A further object of the present invention is to provide compositions that are "self-sealing", that is, when they have been cut through, for example, and the parts separated from one another by the cut are sufficiently close to one another, that they flow together again. A still further object of the present invention is to provide compositions in which the crosslinked products do not flow off the substrates on which these products have been formed. A still further object of the present invention is to provide compositions which are extremely well suited for encapsulating electronic components. A still further object of the present invention is to provide compositions that are substantially free of Si-bonded hydroxyl groups, titanium compounds and tin compounds, but crosslink rapidly when exposed to ultraviolet light.

SUMMARY OF THE INVENTION

The foregoing objects and others which will become apparent from the following description are accomplished in accordance with this invention, generally speaking, by providing organopolysiloxane compositions which are crosslinkable by ultraviolet light, in which the organopolysiloxanes contain units of the formula $$HR^1C=CR^2COOR^3SiR_2O_{\frac{1}{2}},$$

and units of the formula $$HSR^3R_aSiO_{\frac{3-a}{2}},$$

where R is selected from the group consisting of a monovalent hydrocarbon radical or a halogenated hydrocarbon radical, $R^1$ is selected from the group consisting of hydrogen or a halogenated phenyl radical, $R^2$ is selected from the group consisting of hydrogen or an alkyl radical having from 1 to 4 carbom atoms per radical, and $R^3$ is selected from the group consisting of a divalent hydrocarbon radical or a halogenated divalent hydrocarbon radical and a is 0 or 1.

DESCRIPTION OF THE INVENTION

The organopolysiloxane compositions which are crosslinkable by ultraviolet light comprise (A) an organopolysiloxane having units of the formula $$HR^1C=CR^2COOR^3SiR_2O_{\frac{1}{2}},$$

in which the organopolysiloxane has 2 such siloxane units per molecule and at least 80 percent of the number of the remaining siloxane units of organopolysiloxane (A) comprise units of the formula $$R_2SiO,$$

where R is a monovalent hydrocarbon radical or a halogenated hydrocarbon radical, $R^1$ is hydrogen or a halogenated phenyl radical, $R^2$ is hydrogen or an alkyl radical having from 1 to 4 carbon atoms per radical and $R^3$ is a divalent hydrocarbon radical or a halogenated divalent hydrocarbon radical, (B) an organopolysiloxane having terminal units of the formula $R_3SiO_{\frac{1}{2}}$, where R is the same as above, and has from 0.05 to 5 mole percent of units of the formula $$HSR^3R_aSiO_{\frac{3-a}{2}},$$

in which at least 99 mole percent of the remaining siloxane units, other than the triorganosiloxy groups, comprising units of the formula $$R_2SiO,$$

where R and $R^3$ are the same as above and a is 0 or 1, and (C) a photosensitizer, in which Si-bonded hydroxy groups that are present in units of the formula $$R_2SiO$$

are present in an amount which does not exceed 0.2 hydroxy groups per group of the formula $$HR^1C=CR^2COOR^3—,$$

and organic titanium or organic tin compounds are present in these compositions in a total amount which does not exceed 0.02 percent by weight, based on the total weight of the organopolysiloxane (A), organopolysiloxane (B) and photosensitizer (C).

Examples of hydrocarbon radicals represented by R are alkyl radicals having from 1 to 18 carbon atoms per radical, such as methyl, ethyl, n-propyl, isopropyl, n-butyl and sec-butyl radicals, and also octadecyl radicals; cycloalkyl radicals having from 5 to 8 carbon atoms per radical, such as the cyclohexyl and cycloheptyl radicals, and also methylcyclohexyl radicals; radicals having aliphatic carbon-carbon double bonds and from 2 to 18 carbon atoms per radical, in which these radicals are built up from carbon and hydrogen atoms as single atoms, such as the vinyl and allyl radicals; aryl radicals having from 6 to 12 carbon atoms per radical, such as the phenyl and xenyl radicals; alkaryl radicals having from 7 to 18 carbon atoms, such as the tolyl radicals; and aralkyl radicals having from 7 to 18 carbon atoms per radical, such as the benzyl and betaphenylethyl radical.

Examples of halogenated monovalent hydrocarbon radicals represented by R are the 3-chloropropyl and 3,3,3-trifluoropropyl radicals and o-, m- and p-chlorophenyl radicals.

Preferably, because of their availability, at least 95 percent of the number of radicals represented by R are methyl radicals.

Preferably, $R^1$ is hydrogen. Examples of halogenated phenyl radicals are o-, m- and p-chlorophenyl radicals.

Preferably, $R^2$ is also hydrogen. In addition, $R^2$ may be, for example, a methyl group.

Preferably, $R^3$ is a radical of the formula $—(CH_2)_p—$, wherein p is an integer from 1 to 6, especially 3. Also, $R^3$ may be, for example, a branched alkylene radical, such as a radical of the formula $$—CH_2C(CH_3)_2CH_2—,$$

arylene radicals, such as the phenylene radical, an alkarylene radical, such as radicals of the formula $$—(CH_2)_2C_6H_4—,$$

or an aralkylene radical, such as the toluylene radicals.

Examples of halogenated radicals represented by $R^3$ are o-, m- and p-chlorophenyl radicals.

Siloxane units that may optionally be present in organopolysiloxane (A) in addition to the units of the formula $$HR^1C=CR^2COOR^3SiR_2O_{\frac{1}{2}} \text{ and } R_2SiO$$

are preferably those of the formula $RSiO_{3/2}$, where R is the same as above, or of the formula $SiO_{4/2}$. These siloxane units may be present in organopolysiloxane (A) in an amount totalling up to about 20 percent of the number of siloxane units other than units of the formula $$HR^1C=CR^2COOR^3SiR_2O_{\frac{1}{2}}.$$

Preferably, however, they are present only in amounts of at most 5 percent of the number of all siloxane units in organopolysiloxane (A).

Organopolysiloxane (A) preferably has an average viscosity of from 20 to 5000 mPa.s at 25° C. and more preferably from about 100 to 2000 mPa.s at 25° C.

Processes for preparing organopolysiloxane (A) without the concurrent use of organic titanium or tin compounds, which must first be substantially removed from organopolysiloxane (A) in order for organopolysiloxane (A) to be suitable for the preparation of the compositions of this invention, are known, for example, in DE-OS 28 29 367 (laid open on 8th Feb., 1979, Bausch & Lomb) and DE-OS 32 33 839 (laid open on 22nd Dec., 1983, Wacker-Chemie GmbH).

Preferably, organopolysiloxane (B) contains from 0.5 to 1 mole percent of units of the formula $$HSR^3R_aSiO_{\frac{3-a}{2}}.$$

It is preferred that organopolysiloxane (B) have an average viscosity of from 50 to 2000 mPa.s at 25° C. and more preferably a viscosity of from about 100 to 1000 mPa.s at 25° C.

The siloxane units that may be present in organopolysiloxane (B) in addition to units of the formula $$HSR^3R_aSiO_{\frac{3-a}{2}} \text{ and } R_2SiO$$

are preferably, likewise, those of the formula $RSiO_{3/2}$, where R is the same as above, or those of the formula $SiO_{4/2}$.

The units of the formula $R_3SiO_{\frac{1}{2}}$ are preferably $(CH_3)_3SiO_{\frac{1}{2}}$ units.

Processes for preparing organopolysiloxane (B) without the concurrent use of organic titanium or tin compounds, which must first be substantially removed from organopolysiloxane (B) in order for this organopolysiloxane to be suitable for the preparation of the compositions of this invention, are described, for example, in U.S. Pat. No. 4,046,795 to Martin and British Pat. No. 2 076 842B (Wacker-Chemie GmbH, published on Dec. 7, 1981).

Preferably, the compositions of this invention contain organopolysiloxane (A) and organopolysiloxane (B) in such proportions that from 0.5 to 10 units of the formula $$HSR^3R_aSiO_{\frac{3-a}{2}}$$

are present per unit of the formula $$HR^1C=CR^2COOR^3SiR_2O_{\frac{1}{2}}.$$

Any photosensitizer may be used as photosensitizers (C) in the compositions of this invention. Preference is given to photosensitizers that are soluble in organopolysiloxanes (A) and (B), such as 2-hydroxy-2-methyl-1-phenylpropan-1-one and 2,4-bis-(trimethylsiloxy)-benzophenone. Other examples of photosensitizers (C) are benzophenone and substituted benzophenones, benzoin and substituted benzoins, acetophenone and substituted acetophenones, benzil and substituted benzils. Specific examples of photosensitizers are: acetophenone, 2-ethoxy-2-methylacetophenone, mesityl oxide, propiophenone, benzophenone, xanthone, thioxanthone, fluorenone, benzaldehyde, fluorene, anthraquinone, carbazole, 3-methylacetophenone, 4-methylacetophenone, 3-bromoacetophenone, 4-methylbenzophenone, 4-chlorobenzophenone, 4,4-dimethoxybenzophenone, 4-chloro-4'-benzylbenzophenone, 3-chloroxanthone, 3,9-dichloroxanthone, 3-chloro-8-nonylxanthone, chloroanthraquinones, Michler's ketone, cinnamic acid, benzoinmethyl ether, the disodium salt of anthraquinone-1,5-disulphonic acid, 2-naphthalene sulphonyl chloride, benzil ketals and hydroxybenzophenones.

Preferred photosensitizers are, for example, available under the names "Darocur 1173", "Darocur 1116o and "Darocur 953", from Merck, Darmstadt, FRG.

The amount of photosensitizer may range from about 0.01 to about 5 percent by weight, based on the total amount of organopolysiloxanes (A) and (B).

In addition to the essential ingredients; namely organopolysiloxane (A), organopolysiloxane (B) and photosensitizer (C), the compositions of this invention may also contain other substances. Examples of such other substances are, in particular, materials to improve the adherence of the crosslinked organopolysiloxanes to the substrates on which they have been crosslinked, such as butanediol diacrylic acid ester and gammaglycidoxypropyl triacetoxysilane.

Ultraviolet light having wave lengths in the range of from 200 to 400 nm (nanometers) is preferred.

Crosslinking of the compositions of this invention is preferably carried out at atmosphere pressure, that is, at 1020 hPa (abs.) or approximately 1020 hPa (abs.). If desired, higher or lower pressures may also be used.

The crosslinking is effected within a period of from 0.5 to 20 seconds when the compositions of this invention are exposed to ultraviolet light.

This invention also relates to a process for encapsulating electronic components in which electronic components are encapsulated in a composition containing organopolysiloxane (A), organopolysiloxane (B) and photosensitizer (C) described above and then are exposed to ultraviolet light.

Any electronic components which have previously been encapsulated in organopolysiloxanes may be encapsulated by the process of this invention. Examples of such electronic components are hybrid integrated circuits, for example, for electronic ignitions, modules, photovoltaic solar generators and other semiconductor arrangements.

In the following examples all parts are by weight, unless otherwise specified.

EXAMPLE 1

About 10 parts of an organopolysiloxane of the formula $H_2C=CHCOO(CH_2)_3(CH_3)_2SiO[Si(CH_3)_2O]_b$-$Si(CH_3)_2(CH_2)_3OOCHC=CH_2$, wherein b is an average of about 200 and has a viscosity of 660 mPa.s at 25° C. are mixed as organopolysiloxane (A) with 30 parts of a trimethylsiloxy-terminated organopolysiloxane containing 0.77 mole percent of units of the formula

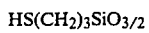

$HS(CH_2)_3SiO_{3/2}$ and 99.23 mole percent of dimethylsiloxane units having a viscosity of 210 mPa.s at 25° C. as organopolysiloxane (B), so that the ratio of mercaptopropyl groups to acryloxypropyl groups is 2.3:1, and with 0.8 parts of 2-hydroxy-2-methyl-1-phenylpropan-1-one as photosensitizer (C).

The viscosity and transparency and all other properties of the mixture thus prepared are completely unchanged even after six-months storage at room temperature in a closed container from which light has been excluded. A 5 mm deep polymethacrylic glass dish in which modules have been placed is filled with this composition, and from a distance of 10 cm this composition is exposed using a mercury-mean pressure-ultraviolet lamp at an output of 80 Watt/cm luminosity and a maximum output at 366 nm. After 5 seconds the liquid is crosslinked to a completely transparent, no longer free-flowing product of gel-like consistency. The composition is heated by the radiated heat of the lamp to only 30° C.

EXAMPLE 2

The method described in Example 1 is repeated, except that 20 parts of organopolysiloxane (B) are used instead of 30 parts of organopolysiloxane (B) so that the ratio of mercaptopropyl groups to acryloxypropyl groups is 1.54:1, and 0.6 parts of photosensitizer (C) are used instead of 0.8 parts of photosensitizer (C). The crosslinking time upon exposure to ultraviolet light is 5 seconds. The crosslinked product is completely transparent, no longer free-flowing and of gel-like consistency. It is somewhat harder and somewhat less tacky than the crosslinked product prepared according to Example 1.

EXAMPLE 3

About 10 parts of organopolysiloxane (A) described in Example 1 are mixed with 15 parts of organopolysiloxane (B) described in Example 1 and with 0.15 parts of photosensitizer (C) of the type specified in Example 1. A hybrid integrated circuit is encapsulated in the composition thus prepared to a maximum layer thickness of 3 mm, and exposed to ultraviolet light in accordance with the procedure described in Example 1. The crosslinking time is 3 seconds. The crosslinked product is transparent, colorless and of gel-like consistency. After heating the crosslinked product at 70° C. for four weeks, no change in its consistency could be detected.

The electrical test values of the crosslinked product are: volume resistivity according to DIN 53 482 at 2 mm layer thickness, dry measurement at 23° C.:5.2 $10^{15}$ ohm-cm; breakdown voltage according to DIN 53 481:21 kV/mm; dielectric constant epsilon at 23° C. in the frequency range from 50 Hz to 5 MHz according to DIN 53 483:2.9 to 3.2; loss tangent tg delta at 23° C. according to DIN 53 843:

| 50 Hz | 5 kHz | 5 MHz |
|---|---|---|
| 155 $10^{-4}$ | 20 $10^{-4}$ | 10 $10^{-4}$ |

Organopolysiloxane (A), which is used in Examples 1, 2 and 3 is prepared in the following manner:

A mixture containing 2130 g (28.78 mole) of a dimethylpolysiloxane having a Si-bonded hydroxy group in each of its terminal units and having an average of about 70 silicon atoms per molecule, 147 g (0.13 mole) of an organopolysiloxane of the formula H₂C=CHCOO(CH₂)₃Si(CH₃)₂O[Si(CH₃)₂]-
9Si(CH₃)₂(CH₂)₃OOCHC=CH₂, and 69 g of acid-treated montmorillonite is heated for 3 hours at 100° C. with agitation. The mixture is subsequently filtered to remove the montmorillonite. The filtrate is organopolysiloxane (A).

The acid-treated montmorillonite used for the preparation of organopolysiloxane (A) is commercially available. It is composed of silicon dioxide, aluminum oxide, ferric oxide, magnesium oxide, sodium oxide and potassium oxide and has the following properties:
  apparent particle density 450 g/l
  tap density 670 g/l
  specific gravity 2.4 kg/l
moisture content (2 h, 110° C.): at most 7 percent by weight;
loss on ignition (1000° C.): at most 7 percent by weight;
pH in 10 percent aqueous suspension: 2.9;
97 percent by weight pass through a screen having an inner mesh width of 150 micrometers.

Organopolysiloxane (B), which is used in Examples 1, 2 and 3, is prepared in the following manner:

A three-necked 4-liter flask equipped with stirrer, thermometer and reflux condenser, and containing a mixture comprising
  782 g (10.5 mole) of dimethylpoysiloxane having a Si-bonded hydroxy group in each terminal unit and 3.5 percent by weight of Si-bonded hydroxy groups
  51.6 g (0.26 mole) of gamma-mercaptopropyl trimethoxysilane
  170 g of toluene
  20 g (0.18 mole) of anhydrous calcium chloride (to bond water formed during the reaction), and
  3 g of acid-treated montmorillonite having the properties listed above,
is heated over a period of 30 minutes to 70° C. with stirring, and is held at 70° C. for 2 hours and then increased to 100° C. for an additional 2 hours. After cooling to 80° C., the contents of the flask are mixed with 1350 g (18.2 mole) of trimethylsiloxy-terminated dimethylpolysiloxane having a viscosity of 100 mPa.s at 25° C., 70 g of acid-treated montmorillonite having the properties described above and 20 g of anhydrous calcium chloride, and heated for 3 hours at 100° C. After cooling, the solid constituents of the mixture is filtered off. The filtrate is identified as organopolysiloxane (B).

What is claimed is:

1. An organopolysiloxane composition crosslinkable by ultraviolet light comprising (A) an organopolysiloxane having units of the formula HR¹C=CR²COOR³SiR₂O₁, where R is selected from the group consisting of a monovalent hydrocarbon radical and a halogenated monovalent hydrocarbon radical, R¹ is selected from hydrogen and a halogenated phenyl radical, R² is selected from the group consisting of hydrogen and an alkyl radical having from 1 to 4 carbon atoms per radical, and R³ is selected from the group consisting of a divalent hydrocarbon radical and a halogenated divalent hydrocarbon radical in which two such siloxane units are present per molecule and at least 80 percent of the number of the remaining siloxane units in organopolysiloxane (A) comprise units of the formula R₂SiO, where R is the same as above, in which organopolysiloxane (A) has an average viscosity of from 20 to 5000 mPa.s at 25° C., (B) an organopolysiloxane having terminal units of the formula R₃SiO₁, where R is the same as above and has from 0.05 to 5 mole percent of units of the formula HSR³R$_a$SiO$_{\frac{3-a}{2}}$, where R and R³ are the same as above, and a is 0 or 1, and up to at least 99 mole percent of the remaining siloxane units, other than the triorganosiloxy groups, comprise units of the formula R₂SiO, where R is the same as above, in which organopolysiloxane (B) has an average viscosity of from 50 to 2000 mPa.s at 25° C., and (C) a photosensitizer, in which Si-bonded hydroxy groups that are present in units of the formula R₂SiO are present in an amount which does not exceed 0.2 hydroxy groups per group of the formula

HR¹C=CR²COOR³—, and a total of at most 0.02 percent by weight, based on the total weight of the organopolysiloxane (A), organopolysloxane (B) and photosensitizer (C), of organic titanium or organic tin compounds are present in the composition.

2. The composition of claim 1, wherein organopolysiloxane (B) contains from 0.5 to 1 mole percent of units of the formula HSR³R$_a$SiO$_{\frac{3-a}{2}}$, where R is selected from the group consisting of a monovalent hydrocarbon radical and a halogenated monovalent hydrocarbon radical, R³ is selected from the group consisting of a divalent hydrocarbon radical and a halogenated divalent hydrocarbon radical and a is 0 or 1.

3. The composition of claim 1, wherein organopolysiloxane (A) has a viscosity of from 100 to 2000 mPa.s at 25° C.

4. The composition of claim 2, wherein organopolysiloxane (A) has a viscosity of from 100 to 2000 mPa.s at 25° C.

5. The composition of claim 1, wherein organopolysiloxane (B) has a viscosity of from 100 to 1000 mPa.s at 25° C.

6. The composition of claim 2, wherein organopolysiloxane (B) has a viscosity of from 100 to 1000 mPa.s at 25° C.

7. The composition of claim 3, wherein organopolysiloxane (B) has a viscosity of from 100 to 1000 mPa.s at 25° C.

8. The composition of claim 1, wherein there are from 0.5 to 10 units of the formula $$HSR^3R_aSiO_{\frac{3-a}{2}}$$

present per unit of the formula $$HR^1C=CR^2COOR^3SiR_2O_{\frac{1}{2}},$$

where R is selected from the group consisting of a monovalent hydrocarbon radical and a halogenated monovalent hydrocarbon radical, $R^1$ is selected from the group consisting of hydrogen and a halogenated phenyl radical, $R^2$ is selected from the group consisting of hydrogen and an alkyl radical having from 1 to 4 carbon atoms per radical, $R^3$ is selected from the group consisting of a divalent hydrocarbon radical and a halogenated divalent hydrocarbon radical and a is 0 or 1.

9. The composition of claim 2, wherein there are from 0.5 to 10 units of the formula $$HSR^3R_aSiO_{\frac{3-a}{2}}$$

present per unit of the formula $$HR^1C=CR^2COOR^3SiR_2O_{\frac{1}{2}},$$

where R is selected from the group consisting of a monovalent hydrocarbon radical and a halogenated monovalent hydrocarbon radical, $R^1$ is selected from the group consisting of hydrogen and a halogenated phenyl radical, $R^2$ is selected from the group consisting of hydrogen and an alkyl radical having from 1 to 4 carbon atoms per radical, $R^3$ is selected from the group consisting of a divalent hydrocarbon radical and a halogenated divalent hydrocarbon radical and a is 0 or 1.

10. The composition of claim 3, wherein there are from 0.5 to 10 units of the formula $$HSR^3R_aSiO_{\frac{3-a}{2}}$$

present per unit of the formula $$HR^1C=CR^2COOR^3SiR_2O_{\frac{1}{2}},$$

where R is selected from the group consisting of a monovalent hydrocarbon radical and a halogenated monovalent hydrocarbon radical, $R^1$ is selected from the group consisting of hydrogen and a halogenated phenyl radical, $R^2$ is selected from the group consisting of hydrogen and an alkyl radical having from 1 to 4 carbon atoms per radical, $R^3$ is selected from the group consisting of a divalent hydrocarbon radical and a halogenated divalent hydrocarbon radical and a is 0 or 1.

11. The composition of claim 4, wherein there are from 0.5 to 10 units of the formula $$HSR^3R_aSiO_{\frac{3-a}{2}}$$

present per unit of the formula $$HR^1C=CR^2COOR^3SiR_2O_{\frac{1}{2}},$$

where R is selected from the group consisting of a monovalent hydrocarbon radical and a halogenated monovalent hydrocarbon radical, $R^1$ is selected from the group consisting of hydrogen and a halogenated phenyl radical, $R^2$ is selected from the group consisting of hydrogen and an alkyl radical having from 1 to 4 carbon atoms per radical, $R^3$ is selected from the group consisting of a divalent hydrocarbon radical and a halogenated divalent hydrocarbon radical and a is 0 to 1.

12. A process for encapsulating electronic components, which comprises encapsulating electronic components in the composition of claim 1, and thereafter crosslinking the composition with ultraviolet light.

13. The process of claim 12, wherein the electronic components are encapsulated in the composition of claim 2.

14. The process of claim 12, wherein the electronic components are encapsulated in the composition of claim 8.

15. The process of claim 13, wherein the electronic components are encapsulated in the composition of claim 8.

* * * * *